United States Patent
Rao et al.

(10) Patent No.: US 11,621,668 B2
(45) Date of Patent: Apr. 4, 2023

(54) SOLAR ARRAY FAULT DETECTION, CLASSIFICATION, AND LOCALIZATION USING DEEP NEURAL NETS

(71) Applicants: Sunil Srinivasa Manjanbail Rao, Tempe, AZ (US); Andreas Spanias, Tempe, AZ (US); Cihan Tepedelenlioglu, Chandler, AZ (US)

(72) Inventors: Sunil Srinivasa Manjanbail Rao, Tempe, AZ (US); Andreas Spanias, Tempe, AZ (US); Cihan Tepedelenlioglu, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 293 days.

(21) Appl. No.: 16/868,050

(22) Filed: May 6, 2020

(65) Prior Publication Data

US 2020/0358396 A1  Nov. 12, 2020

Related U.S. Application Data

(60) Provisional application No. 62/843,821, filed on May 6, 2019.

(51) Int. Cl.
  *G01R 31/28* (2006.01)
  *H02S 50/10* (2014.01)
  *G06N 3/084* (2023.01)

(52) U.S. Cl.
  CPC .......... *H02S 50/10* (2014.12); *G01R 31/2846* (2013.01); *G06N 3/084* (2013.01)

(58) Field of Classification Search
  CPC ..... H02S 50/10; H02S 50/00; G01R 31/2846; G01R 31/52; G06N 3/084; Y02E 10/50
  See application file for complete search history.

(56) References Cited

U.S. PATENT DOCUMENTS

| | | | |
|---|---|---|---|
| 9,461,676 B2 | 10/2016 | Santucci et al. | |
| 9,507,011 B2 | 11/2016 | Zhang et al. | |
| 9,710,916 B2 | 7/2017 | Thiagarajan et al. | |
| (Continued) | | | |

FOREIGN PATENT DOCUMENTS

CN   104391189 B   *   3/2017   ............. G01R 31/00

OTHER PUBLICATIONS

Rao et al. "Solar array fault detection using neural networks" 2019 IEEE International Conference on Industrial Cyber Physical Systems (ICPS), IEEE, 2019, pp. 196-200.

(Continued)

*Primary Examiner* — Jung Kim
(74) *Attorney, Agent, or Firm* — Polsinelli PC

(57) ABSTRACT

Solar array fault detection, classification, and localization using deep neural nets is provided. A fault-identifying neural network uses a cyber-physical system (CPS) approach to fault detection in photovoltaic (PV) arrays. Customized neural network algorithms are deployed in feedforward neural networks for fault detection and identification from monitoring devices that sense data and actuate each individual module in a PV array. This approach improves efficiency by detecting and classifying a wide variety of faults and commonly occurring conditions (e.g., eight faults/conditions concurrently) that affect power output in utility scale PV arrays.

9 Claims, 8 Drawing Sheets

(56) References Cited

U.S. PATENT DOCUMENTS

| | | | |
|---|---|---|---|
| 9,779,497 | B2 | 10/2017 | Thiagarajan et al. |
| 9,875,428 | B2 | 1/2018 | Ramamurthy et al. |
| 10,387,751 | B2 | 8/2019 | Braun et al. |
| 10,440,553 | B2 | 10/2019 | Zhang et al. |
| 2019/0108444 | A1 | 4/2019 | Song et al. |
| 2019/0384983 | A1 | 12/2019 | Katoch et al. |
| 2020/0226471 | A1 | 7/2020 | Shanthamallu et al. |
| 2020/0226472 | A1 | 7/2020 | Shanthamallu et al. |
| 2020/0236402 | A1 | 7/2020 | Spanias et al. |
| 2020/0274484 | A1 | 8/2020 | Narayanaswamy et al. |
| 2021/0012472 | A1 | 1/2021 | Spanias et al. |

OTHER PUBLICATIONS

Akram et al., "Modeling and Health Monitoring of DC Side of Photovoltaic Array," IEEE Transactions on Sustainable Energy, vol. 6, No. 4, Oct. 2015, pp. 1245-1253.
Ali et al., "Real time fault detection in photovoltaic systems," 8th International Conference on Sustainability in Energy and Buildings, Sep. 11-13, 2016, Turin, Italy, Energy Procedia, vol. 111, 2017, pp. 914-923.
Bacher et al., "Online short-term solar power forecasting," Solar Energy, vol. 83, No. 10, Oct. 2009, pp. 1772-1783.
Berisha et al., "Empirically Estimable Classification Bounds Based on a Nonparametric Divergence Measure," IEEE Transactions on Signal Processing, vol. 64, No. 3, Feb. 1, 2016, pp. 580-591.
Bosco, N., "Reliability concerns associated with PV technologies," National Renewable Energy Laboratory, Apr. 2010, 11 pages.
Braun et al., "Signal processing for fault detection in photovoltaic arrays," IEEE International Conference on Acoustics, Speech and Signal Processing (ICASSP), Mar. 25-30, 2012, Kyoto, Japan, pp. 1681-1684.
Braun et al., "Signal processing for solar array monitoring, fault detection, and optimization," Synthesis Lectures on Power Electronics #4, vol. 3, No. 1, Sep. 2012, Morgan & Claypool Publishers, 95 pages.
Braun et al., "Topology reconfiguration for optimization of photovoltaic array output," Sustainable Energy, Grids and Networks, vol. 6, Jun. 2016, pp. 58-69.
Brooks, B., "The Bakersfield Fire: A Lesson in Ground-Fault Protection," Solar Pro, Issue 4.2, Feb./Mar. 2011, pp. 62-70.
Buddha et al., "Signal processing for photovoltaic applications," IEEE International Conference on Emerging Signal Processing Applications, Jan. 12-14, 2012, Las Vegas, NV, pp. 115-118.
Cadez et al., "Hierarchical Models for Screening of Iron Deficiency Anemia," Proceedings of the 16th International Conference on Machine Learning, Jun. 1999, pp. 77-86.
Chen et al., "Intelligent fault diagnosis of photovoltaic arrays based on optimized kernel extreme learning machine and I-V characteristics," Applied Energy, vol. 204, Oct. 15, 2017, pp. 912-931.
Chine et al., "A novel fault diagnosis technique for photovoltaic systems based on artificial neural networks," Renewable Energy, vol. 90, May 2016, pp. 501-512.
Chu et al., "A smart image-based cloud detection system for intrahour solar irradiance forecasts," Journal of Atmospheric and Oceanic Technology, vol. 31, No. 9, Sep. 2014, pp. 1995-2007.
Ciabattoni et al., "Solar Irradiation Forecasting using RBF Networks for PV Systems with Storage," IEEE International Conference on Industrial Technology, Mar. 19-21, 2012, Athens, Greece, pp. 699-704.
Dobos, A., "PVWatts version 1 technical reference," National Renewal Energy Laboratory (NREL), Technical Report TP-6A20-60272, Oct. 2013, 11 pages.
Du et al., "Based on the Internet of things a self-cleaning solar power system of the household micro-grid," 28th Chinese Control and Decision Conference, IEEE, May 28-30, 2016, Tinchuan, China, pp. 2889-2890.
Frankle et al., "The lottery ticket hypothesis: Finding sparse, trainable neural networks," 7th International Conference on Learning Representations, May 6-9, 2019, New Orleans, LA, 42 pages.
Gal et al., "Concrete Dropout," 31st Conference on Neural Information Processing Systems (NIPS), May 2017, Long Beach, CA, 10 pages.
Gooodfellow et al., "Deep Learning," MIT Press, 2016, URL: https://www.deeplearningbook.org/.
Gregory et al., "The arc-fault circuit interrupter: an emerging product," IEEE Transactions on Industry Applications, vol. 34, No. 5, Sep.-Oct. 1998, pp. 928-933.
Haeberlin et al., "Measurement of Damages at Bypass Diodes by Induced Voltages and Currents in PV Modules Caused by Nearby Lightning Currents with Standard Waveform," 23rd European Photovoltaic Solar Energy Conference, Sep. 2008, Valencia, Spain, pp. 1-14.
Hariharan et al., "A method to detect photovoltaic array faults and partial shading in pv systems," IEEE Journal of Photovoltaics, vol. 6, No. 5, Sep. 2018, pp. 1278-1285.
Hassanzadeh et al., "Practical Approach for Sub-Hourly and Hourly Prediction of PV Power Output," North American Power Symposium 2010, Sep. 26-28, 2010, Arlington, TX, 5 pages.
Jiang et al., "Automatic fault detection and diagnosis for photovoltaic systems using combined artificial neural network and analytical based methods," International Joint Conference on Neural Networks, IEEE, Jul. 12-17, 2015, Killarney, Ireland, 8 pages.
Katoch et al., "Shading Prediction, Fault Detection, and Consensus Estimation for Solar Array Control," IEEE Industrial Cyber-Physical Systems (ICPS), May 15-18, 2018, St. Petersburg, Russia, pp. 217-222.
Khondoker et al., "Photovoltaic Array Simulation and Fault Prediction via Multilayer Perceptron Models," 2018 9th International Conference on Information, Intelligence, Systems and Applications (IISA), Jul. 23-25, 2018, Zakynthos, Greece, 5 pages.
King et al., "Photovoltaic array performance model," Sandia Report SAND2004-3535, Sandia National Laboratories, Dec. 2004, 43 pages.
Maish et al., "Photovoltaic system reliability," Conference Record of the 26th IEEE Photovoltaic Specialists Conference, Sep. 29-Oct. 3, 1997, Anaheim, CA, pp. 1049-1054.
Marquez et al., "Hybrid solar forecasting method uses satellite imaging and ground telemetry as inputs to ANNs," Solar Energy, vol. 92, Jun. 2013, pp. 176-188.
Mekki et al., "Artificial neural network-based modelling and fault detection of partial shaded photovoltaic modules," Simulation Modeling Practice and Theory, vol. 67, Sep. 2016, pp. 1-13.
Mellit et al., "Fault detection and diagnosis methods for photovoltaic systems: A review," Renewable and Sustainable Energy Reviews, vol. 91, Aug. 2018, pp. 1-17.
Muniraju et al., "A cyber-physical photovoltaic array monitoring and control system," International Journal of Monitoring and Surveillance Technologies Research, vol. 5, No. 3, Jul.-Sep. 2017, pp. 33-56.
Nguyen et al., "Modeling and simulation of solar pv arrays under changing illumination conditions," IEEE Workshops an Computers in Power Electronics, Jul. 16-19, 2006, Troy, NY, pp. 295-299.
Nilsson, D., "Fault detection in Photovoltaic Systems," Master's Thesis, School of Computer Science and Communication (CSC), KTH Royal Institute of Technology, 2014, 36 pages.
Opengear, Inc., "Benefits of IoT for Solar Power," URL: https://web.archive.org/web/20170612102406/http://opengear.com/articles/benefits-challenges-iot-solar-energy, accessed 2017.
Platon et al., "Online fault detection in PV systems," IEEE Transactions on Sustainable Energy, vol. 6, No. 4, Oct. 2015, pp. 1200-1207.
Quaschning et al., "Numerical simulation of current-voltage characteristics of photovoltaic systems with shaded solar cells," Solar Energy, vol. 56, No. 6, 1196,pp. 513-520.
Quesada-Ruiz et al., "Cloud-tracking methodology for intra-hour DNI forecasting," Solar Energy, vol. 102, Apr. 2014, pp. 267-275.
Rao et al., "A Cyber-Physical System Approach for Photovoltaic Array Monitoring and Control," 8th International Conference on

(56) References Cited

OTHER PUBLICATIONS

Information, Intelligence, Systems, and Applications, IEEE, Aug. 27-30, 2017, Larnaca, Cyprus, 6 pages.

Rao et al., "An 18 kW Solar Array Research Facility for Fault Detection Experiments," Proceedings of the 18th Mediterranean Electricotechnical Conference, Apr. 18-20, 2016, Limassol, Cyprus, 5 pages.

Rousseeuw et al., "A fast algorithm for the minimum covariance determinant estimator," Technometrics, vol. 41, No. 3, Aug. 1999, pp. 212-223.

Shanthamallu et al., "A Brief Survey of Machine Learning Methods and their Sensor and IoT Applications," 8th International Conference on Information, Intelligence, Systems, and Applications, Aug. 27-30, 2017, Larnaca, Cyprus, 8 pages.

Spanias, A., "Solar Energy Management as an Internet of Things (IoT) Application," IEEE International Conference on Information, Intelligence, Systems, and Applications, Aug. 27-30, 2017, Larnaca, Cyprus, 4 pages.

Srivastava et al., "Dropout: A simple way to prevent neural networks from overfitting," Journal of Machine Learning Research, vol. 15, Jun. 2014, pp. 1929-1958.

Tina et al., "Analysis of forecast errors for irradiance on the horizontal plane," Energy Conversion and Management, vol. 64, Dec. 2012, pp. 533-540.

Van Der Maaten, et al., "Visualizing data using t-SNE," Journal of Machine Learning Research, vol. 9, Nov. 2008, pp. 2579-2605.

Villalva et al., "Comprehensive Approach to Modeling and Simulation of Photovoltaic Arrays," IEEE Transactions on Power Electronics, vol. 24, No. 5, May 2009, pp. 1198-1208.

Zhao et al., "Decision tree-based fault detection and classification in solar photovoltaic arrays," 27th Annual IEEE Applied Power Electronics Conference and Exposition (APEC), Feb. 5-9, 2012, Orlando, FL, pp. 93-99.

Zhao et al., "Graphbased semi-supervised learning for fault detection and classification in solar photovoltaic arrays," IEEE Transactions on Power Electronics, vol. 30, No. 5, May 2015, pp. 2848-2858.

\* cited by examiner

FIG. 9

SOLAR ARRAY FAULT DETECTION, CLASSIFICATION, AND LOCALIZATION USING DEEP NEURAL NETS

RELATED APPLICATIONS

This application claims the benefit of provisional patent application Ser. No. 62/843,821, filed May 6, 2019, the disclosure of which is hereby incorporated herein by reference in its entirety.

GOVERNMENT SUPPORT

This invention was made with government support under 1646542 awarded by the National Science Foundation. The government has certain rights in the invention.

FIELD OF THE DISCLOSURE

The present disclosure relates to fault detection in solar arrays.

BACKGROUND

Reliability is a critical factor for a photovoltaic (PV) system. Issues such as ground faults, series and parallel arc faults, open circuits, short circuits, soiling, and partial shading can reduce efficiency and need to be addressed. Some of these faults are undetected for a prolonged length of time in real-world situations. This leads to reduced and inefficient functioning of a PV array and a significantly lower power output. Unnoticed faults in PV arrays can be dangerous and potentially life threatening. A real-world example would be the Bakersfield fire which was caused due to an undetected ground fault. Although ground faults can now be detected with the use of inverters, faults such as soiling and short circuits between panels often go undetected.

FIG. 1 illustrates a model of a solar cell or PV module 10 (e.g., panel) as a current source and a diode, with parasitic series and shunt resistance. The current-voltage (I-V) data in a PV array can be measured at the module level inexpensively. This data is useful since it can be used to build correlation models, and is useful in predicting ground faults, arc faults, soiling shading, and so on. The I-V characteristic is a function of temperature, incoming solar irradiance (direct and diffused), open circuit voltage ($V_{oc}$), and short circuit current ($I_{sc}$). Each PV module 10 has a peak operating point, which can be referred to as the maximum power point (MPP). Fault detection using I-V data can be accomplished by measuring MPPs and observing the variation of the measured MPP from the actual MPP.

Fault detection in PV arrays has been studied extensively. Some approaches use statistical methods to identify faults, and other approaches use graph and neural network architectures to detect and identify faults. However, none of these approaches cover a wide range of faults. These approaches do not localize faults at each individual PV module 10, but rather look at an entire array.

SUMMARY

Solar array fault detection, classification, and localization using deep neural nets is provided. Embodiments use a cyber-physical system (CPS) approach to fault detection in photovoltaic (PV) arrays. Customized neural network algorithms are deployed in feedforward neural networks for fault detection and identification from monitoring devices that sense data and actuate at each individual module in a PV array. This approach improves efficiency by detecting and classifying a wide variety of faults and commonly occurring conditions (e.g., eight faults/conditions concurrently) that affect power output in utility scale PV arrays.

An exemplary embodiment provides a fault-identifying neural network for a PV array. The fault-identifying neural network includes an input layer configured to receive measurements from the PV array; a hidden layer configured to analyze the received measurements; and a decision layer configured to classify a type of fault among a plurality of types of fault in the analyzed measurements.

Another exemplary embodiment provides a method for classifying faults in a PV array. The method includes receiving measurements from the PV array; extracting a plurality of features from the measurements; and classifying a fault in the PV array among a plurality of types of fault based on the plurality of features.

Another exemplary embodiment provides a solar monitoring system. The solar monitoring system includes a database configured to receive and store measurements from one or more PV monitoring devices; and a processor configured to classify a type of fault by concurrently comparing the stored measurements against a plurality of types of fault.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9 is a graphical representation of a confusion matrix for fault classification.

DETAILED DESCRIPTION

Figure 1:
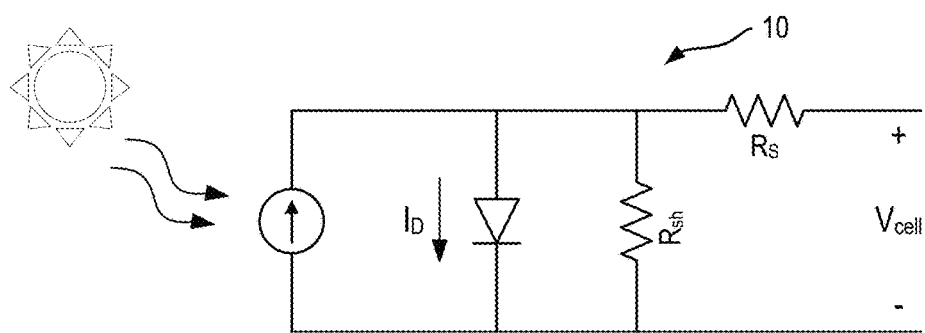
FIG. 1 illustrates a model of a solar cell or photovoltaic (PV) module (e.g., panel) as a current source and a diode, with parasitic series and shunt resistance.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Solar array fault detection, classification, and localization using deep neural nets is provided. Embodiments use a cyber-physical system (CPS) approach to fault detection in photovoltaic (PV) arrays. Customized neural network algorithms are deployed in feedforward neural networks for fault detection and identification from monitoring devices that sense data and actuate at each individual module in a PV array. This approach improves efficiency by detecting and classifying a wide variety of faults and commonly occurring conditions (e.g., eight faults/conditions concurrently) that affect power output in utility scale PV arrays.

Figure 2:
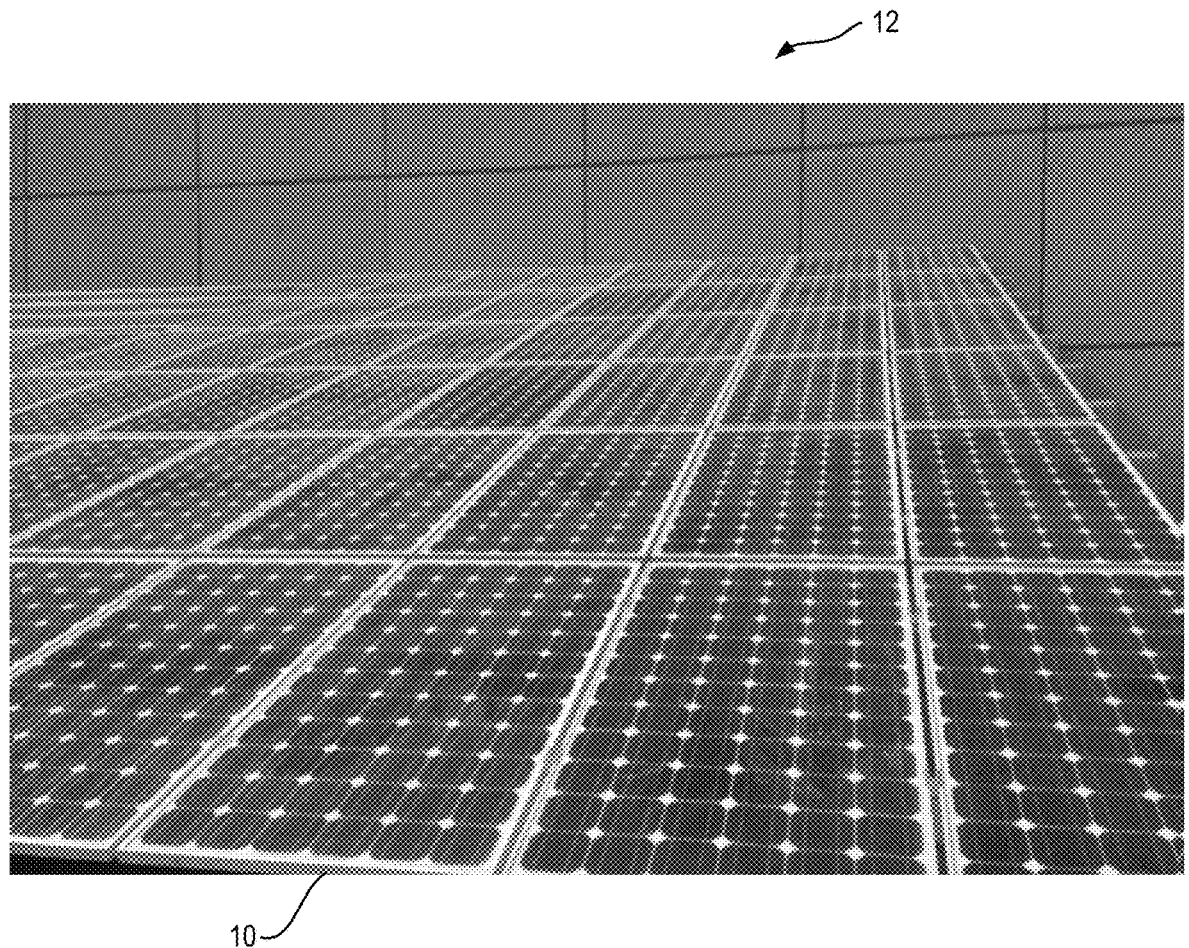
FIG. 2 is an image depicting an exemplary PV array which may be monitored for fault detection, classification, and localization according to embodiments described herein.

FIG. 2 is an image depicting an exemplary PV array 12 which may be monitored for fault detection, classification, and localization according to embodiments described herein. The exemplary PV array 12 of FIG. 2 is an 18 kilowatt (kW) array of 104 PV modules 10 (e.g., panels). Other examples may include larger or smaller arrays as appropriate.

The efficiency of solar energy systems, which may include the PV array 12, requires detailed analytics for each PV module 10 including voltage, current, temperature, and irradiance. Solar power output is affected by factors such as cloud cover, soiling of PV modules 10, short circuits between PV modules 10, unexpected faults, and varying weather conditions. Embodiments disclosed herein use machine learning and neural network approaches for fault detection. These approaches are aimed at improving the efficiency and reliability of utility scale PV arrays 12.

Figure 3:
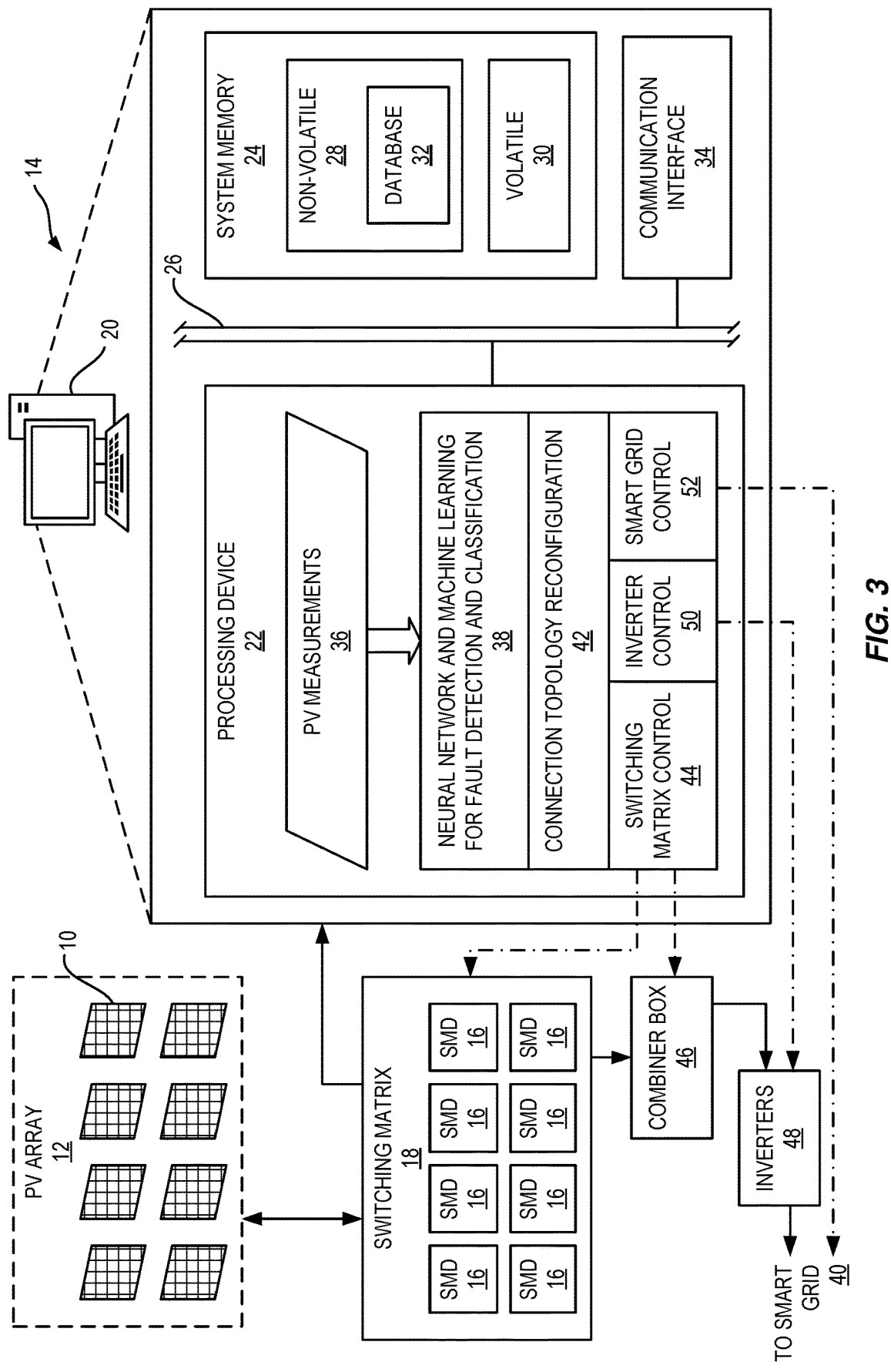
FIG. 3 is a schematic diagram of an exemplary solar monitoring system for the PV array of FIG. 2.

FIG. 3 is a schematic diagram of an exemplary solar monitoring system 14 for the PV array 12 of FIG. 2. The solar monitoring system 14 improves PV module 10 efficiency using machine learning techniques to learn and predict multiple system parameters using sensors and sensor fusion. Training and test data are acquired through cyber-physical methods including sensors and actuators. The solar monitoring system also uses machine learning and deep learning algorithms for fault detection, which improves efficiency.

Parameter sensing at each PV module 10 provides information for fault detection and power output optimization. Neural networks and sensor fusion enable robust shading estimation and fault detection algorithms. In this regard, one or more smart monitoring devices (SMDs) 16 are deployed with sensors that measure current, voltage, and temperature. The data obtained from these sensors is used for fault diagnosis in one or more PV arrays 12. The SMDs 16 also have relays that enable dynamical reconfiguration of connection topologies.

With continuing reference to FIG. 2 and FIG. 3, a utility-scale PV array 12 consists of PV modules 10 that are connected as a combination of series and parallel strings to maximize power output. Shading, weather patterns, and temperature can severely affect power output. To minimize these effects, individual module current-voltage (I-V) measurements and local weather information are provided to the solar monitoring system 14 of FIG. 3. Power output is controlled through a switching matrix 18 (e.g., by providing real time topological changes with relay switches in each SMD 16) coupled to the PV array 12 (e.g., one SMD 16 per PV module 10), allowing for several interconnection options. Utility scale PV array systems are optimized by exploiting the measured I-V and weather data. In some examples, each SMD 16 is connected to a corresponding individual PV module 10 and collects metrics (current, voltage, and temperature) of the individual PV module 10 periodically (e.g., every eight to ten seconds).

In an exemplary aspect, the solar monitoring system 14 includes or is implemented as a computer system 20, which comprises any computing or electronic device capable of including firmware, hardware, and/or executing software instructions that could be used to perform any of the methods or functions described herein, such as classifying faults in the PV array 12. In this regard, the computer system 20 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 20 in this embodiment includes a processing device 22 or processor, a system memory 24, and a system bus 26. The system memory 24 may include non-volatile memory 28 and volatile memory 30. The non-volatile memory 28 may include read-only memory (ROM), erasable programmable read-only memory (EPROM), electrically erasable programmable read-only memory (EEPROM), and the like. In some examples, the non-volatile memory 28 includes a database 32 storing measurements from the PV array 12, instructions, program modules, and the like. The volatile memory 30 generally includes random-access memory (RAM) (e.g., dynamic random access memory (DRAM), such as synchronous DRAM (SDRAM)).

The system bus 26 provides an interface for system components including, but not limited to, the system memory 24 and the processing device 22. The system bus 26 may be any of several types of bus structures that may further interconnect to a memory bus (with or without a memory controller), a peripheral bus, and/or a local bus using any of a variety of commercially available bus architectures.

The processing device 22 represents one or more commercially available or proprietary general-purpose processing devices, such as a microprocessor, central processing unit (CPU), or the like. More particularly, the processing device 22 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 22 is configured to execute processing logic instructions for performing the operations and steps discussed herein.

In this regard, the various illustrative logical blocks, modules, and circuits described in connection with the embodiments disclosed herein may be implemented or performed with the processing device 22, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 22 may be a microprocessor, or may be any conventional processor, controller, microcontroller, or state machine. The processing device 22 may also be implemented as a combination of computing devices (e.g., a combination of a DSP and a microprocessor, a plurality of microprocessors, one or more microprocessors in conjunction with a DSP core, or any other such configuration).

An operator, such as the user, may also be able to enter one or more configuration commands to the computer system 20 through a keyboard, a pointing device such as a mouse, or a touch-sensitive surface, such as the display device, via an input device interface or remotely through a web interface, terminal program, or the like via a communication interface 34. The communication interface 34 may be wired or wireless and facilitate communications with any number of devices via a communications network in a direct or indirect fashion. Additional inputs and outputs to the computer system 20 may be provided through the system bus 26 as appropriate to implement embodiments described herein.

Human operators are currently required to manually perform fault detection and identification in PV arrays 12. Studies have shown that the current method for mean time to repair (MTTR) is approximately 19 days. There is a significant need to reduce MTTR to reduce power losses from the PV array 12. The solar monitoring system 14 of FIG. 3 uses machine learning methods to reduce the MTTR for PV arrays 12.

Fault identification and localization problems pose several challenges. The solar monitoring system 14 must first accurately classify the PV array 12 condition and then react to unseen data to correctly classify the condition of operation of the PV array 12. Considering these challenges, the solar monitoring system 14 uses machine learning techniques. Semi-supervised learning can be used to label many realistic faults from few measured examples.

As described further below, the solar monitoring system 14 incorporates a unique set of custom features for fault detection and identification. In an exemplary aspect, the processing device 22 may be configured to implement machine learning algorithms described herein to detect, classify, and localize faults. The machine learning algorithms operate on measurements 36 received from the PV array 12 (e.g., via the SMDs 16 coupled to individual PV modules 10). The processing device 22 implements a custom neural network and machine learning for fault detection and classification 38 for the one or more PV arrays 12 (e.g., using parametric models). Accordingly, embodiments can detect and identify/classify multiple (e.g., eight) different commonly occurring cases in PV arrays 12 concurrently.

The processing device 22 can further use the outputs from the neural network to control aspects of the PV array 12 and a smart grid 40. For example, the SMDs 16 can perform module switching or bypassing if necessary. The processing device 22 can use relays in the SMDs 16 to reconfigure multiple connection topologies 42 (e.g., with a switching matrix control function 44, which may also control a combiner box 46). Inverters 48 which connect the PV array 12 to the smart grid 40 or another alternating current (AC) power system can also be controlled by an inverter control function 50. Finally, control of the smart grid 40 may be provided via a smart grid control function 52.

Machine Learning for Fault Identification

The K-means algorithm is a clustering-based approach in machine learning that can be used for fault detection. Given a dataset, K-means clustering partitions n observations into k clusters. Each observation belongs to the cluster with the nearest mean. The mean serves as a representative of the cluster.

Figure 4:
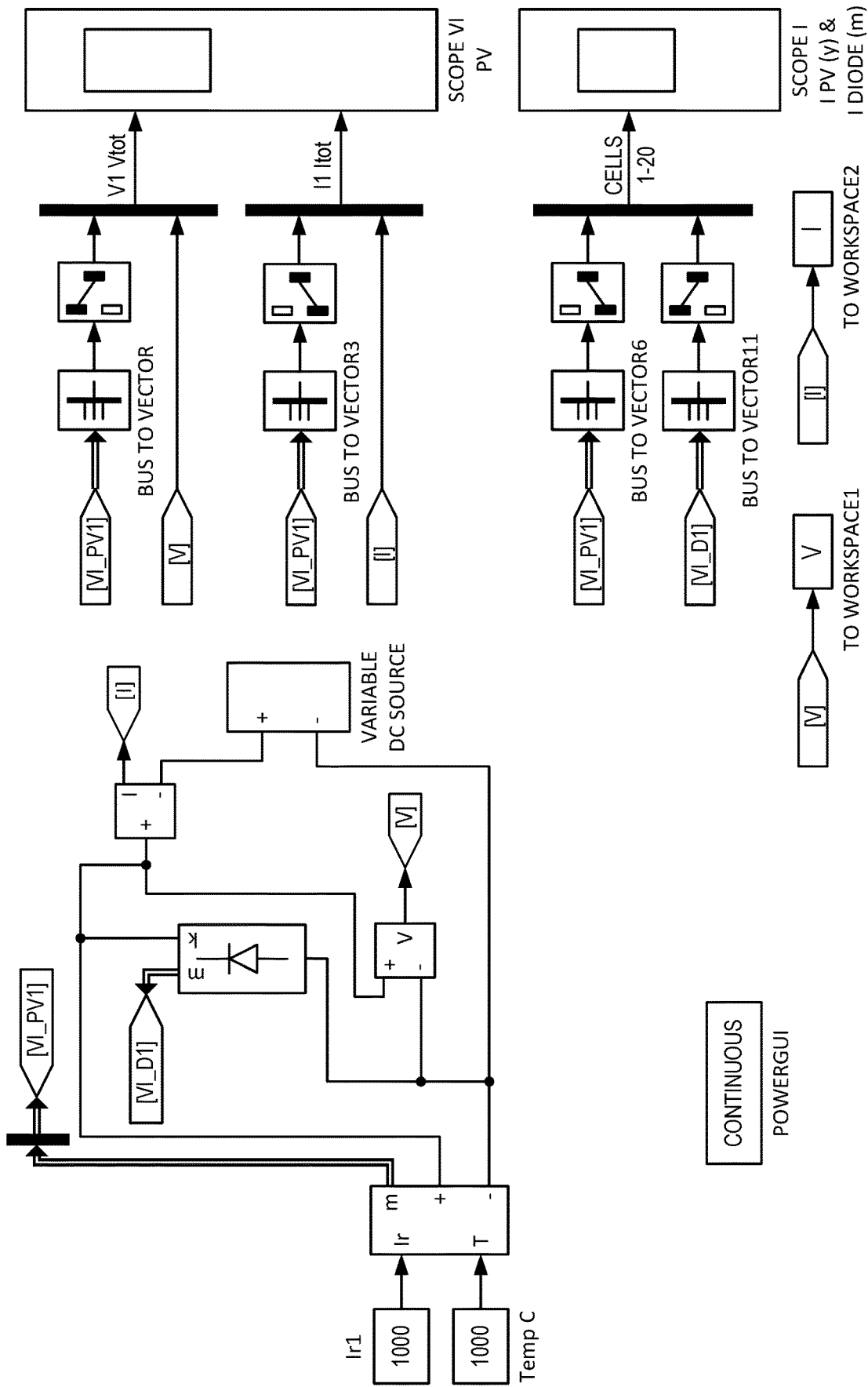
FIG. 4 is a schematic diagram of a simulated model used to create a dataset for multiple types of faults.

FIG. 4 is a schematic diagram of a simulated model used to create a dataset for multiple types of faults. The K-means algorithm was applied to data from the simulated model to obtain results illustrated in FIG. 5 (described further below). The simulated model generates simulated data for generating a maximum power point (MPP) for each module (e.g., panel) in an array. While generating MPPs, a variance of ±5 volts (V) for maximum voltage ($V_{mp}$) and a variance of ±1 amp (A) for maximum current ($I_{mp}$) is considered to account for variability in real time scenarios. To simulate a varying temperature module, the simulated module was assigned a higher temperature value. The data was obtained and trained with the K-means algorithm.

Figure 5:
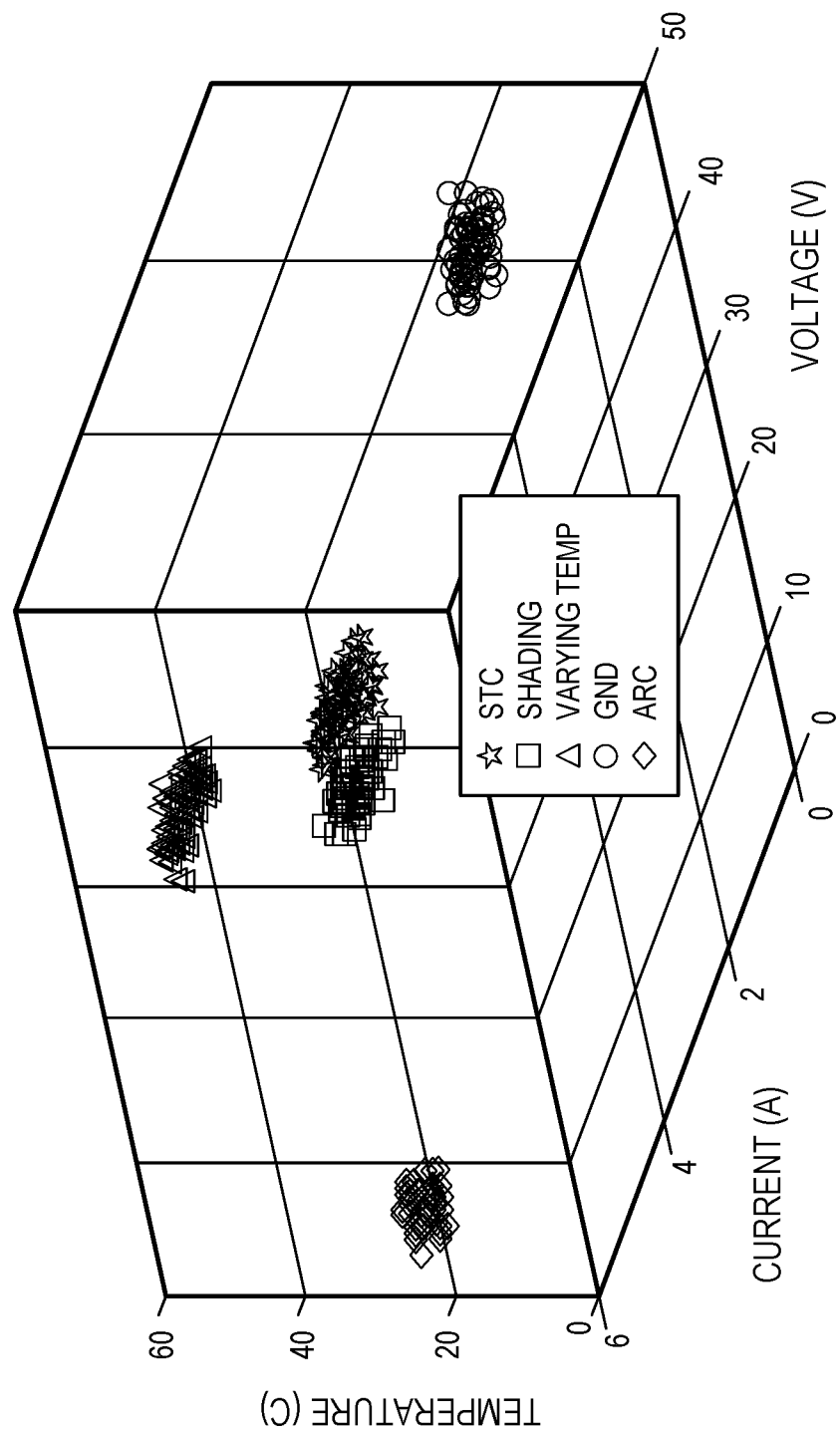
FIG. 5 is a graphical representation of clustering of faults using a K-means algorithm for PV data.

FIG. 5 is a graphical representation of clustering of faults using the K-means algorithm for PV data. Each set of data points represents one condition associated with the PV array. Using K-means with voltage, current, and temperature as three axes in three-dimensional space, the following can be successfully identified: ground faults (Gnd), arc faults (Arc), standard test conditions with irradiance at 1000 watts per square meter ($W/m^2$) and a module temperature of 25° Celsius (C) (STC), shaded conditions (Shading), and varying temperature conditions (Varying Temp).

However, certain other conditions, such as soiling and short circuits, are not identified using this method due to the lack of labels in the dataset. Soiling and short circuits conditions have MPPs which lie in similar areas in the two dimensional I-V curve space. The K-means algorithm also does not identify partial shading versus complete shading of modules. The differentiator for these cases is described below with respect to FIG. 7. There is a need for the use of neural network algorithms to detect and identify faults in PV arrays.

Figure 6:
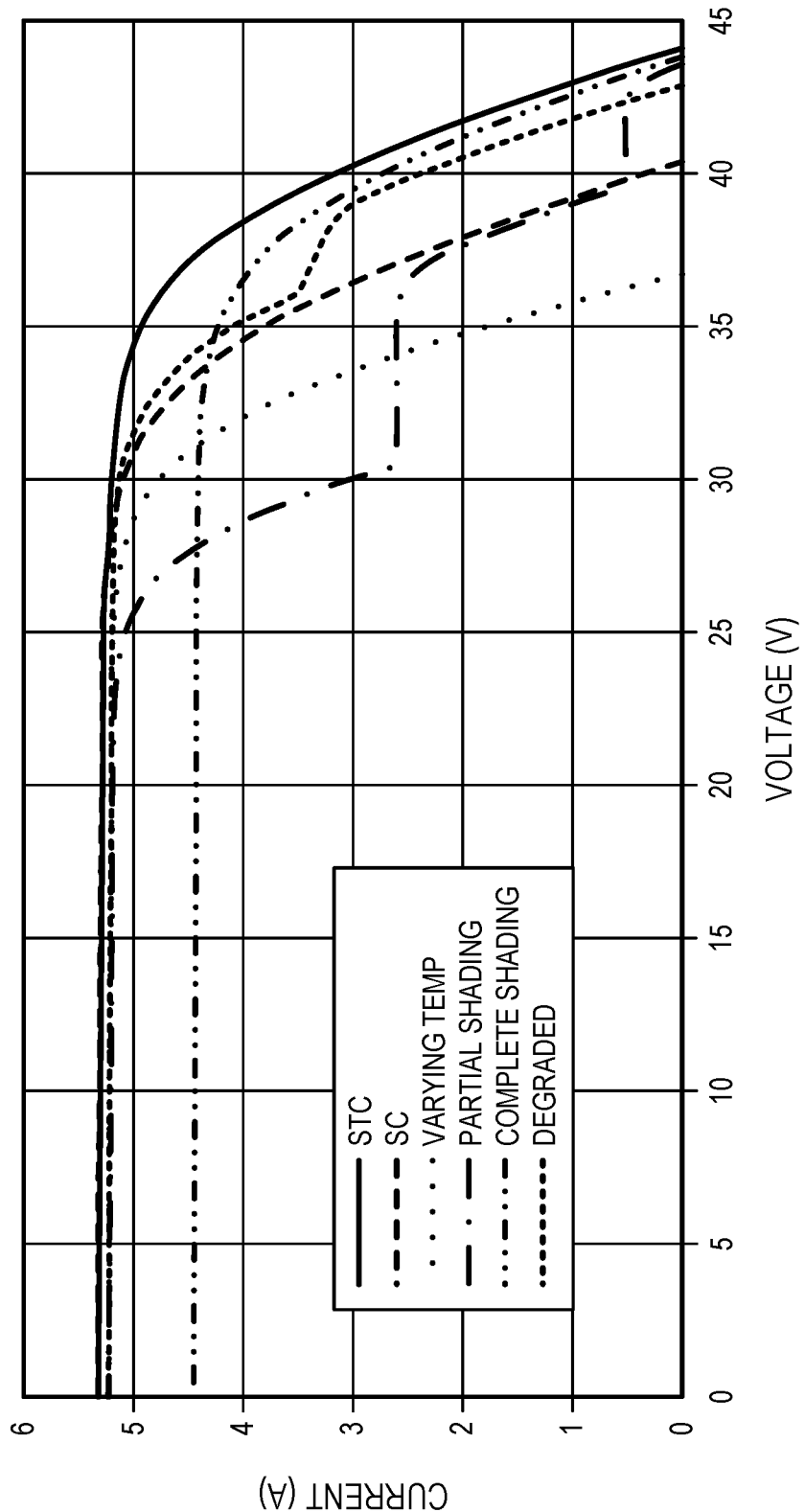
FIG. 6 is a graphical representation of current-voltage (I-V) curves for multiple types of faults.

FIG. 6 is a graphical representation of I-V curves for multiple types of faults. While traditional signal processing algorithms use the statistical properties of a single I-V curve of a given module, most methods do not cover multiple cases. To do this, an exemplary aspect uses neural networks for fault detection and identification. With the use of unsupervised machine learning algorithms, a fault could be detected but not identified as discussed previously. The K-means algorithm described above demonstrates that unsupervised algorithms could not classify the type of fault (e.g., ground fault, arc fault, shading, etc.). An exemplary aspect includes an algorithm which uses partially labelled data to classify unlabelled data. Using neural networks allows not only detection but classification of the fault type with a high accuracy. Multiple different fault and shading conditions (e.g., 8 different cases) can be classified using embodiments of the present disclosure.

Neural Nets for Fault Identification

Figure 7:
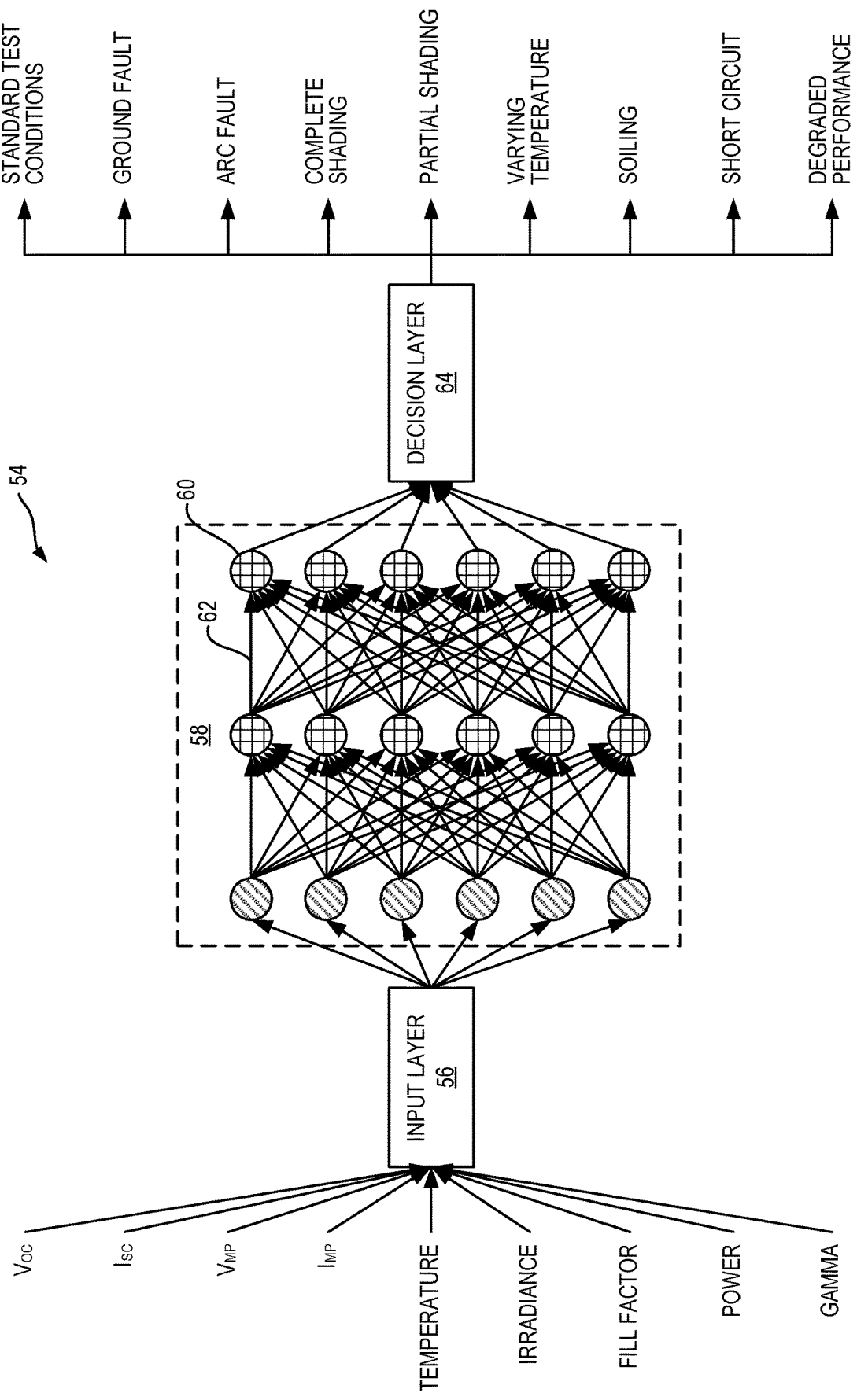
FIG. 7 is a schematic diagram of an exemplary neural network architecture used for fault detection and classification in the solar monitoring system of FIG. 3.

FIG. 7 is a schematic diagram of an exemplary neural network 54 architecture used for fault detection and classification in the solar monitoring system 14 of FIG. 2. The neural network 54 architecture provides a comprehensive algorithm which encapsulates a wide variety of faults. To do this, a multi-layer feedforward neural net is used with multiple inputs as features. A set of unique features is selected as inputs to the neural network 54 and is critical in identifying the type of fault.

The maximum voltage ($V_{mp}$) and maximum currents ($I_{mp}$) lie at the knee of the I-V curve. These two features help identify the power produced by the PV array. Power is chosen as a third feature to help classify shading.

The next set of features includes irradiance and temperature. Irradiance and temperature are critical features which help identify shading conditions from varying temperature conditions. $V_{mp}$ and $I_{mp}$ for shading and varying temperature conditions lie at similar points along the I-V curve, making it difficult to classify the two cases. With these two critical features, along with those previously mentioned, shading can be separated from temperature conditions.

Other features can be considered, such as gamma (γ)—the ratio of power over irradiance, and fill factor—a ratio of the product of the short circuit current ($I_{sc}$) and open circuit voltage ($V_{oc}$) over $V_{mp}$ and $I_{mp}$. These two features capture the area of the I-V curve along different dimensions which help classify multiple shading conditions. For example, multiple shading conditions can include partial shading versus complete shading of the module.

The features $V_{oc}$ and $I_{sc}$ are considered to help in classifying shading versus soiling. Shading and soiling often have overlapping data points and hence it is difficult to identify one versus the other. However, the difference between the two is captured in open circuit voltage and short circuit current causing these two features to serve as distinguishing parameters to identify shading versus soiling.

In some embodiments, the neural network 54 uses $V_{oc}$, $I_{sc}$, $V_{mp}$, $I_{mp}$, temperature of module, irradiance of module, fill factor, power, and gamma to classify eight cases. The eight faults classified are ground fault (Gnd), arc fault (Arc), complete module shading (Fully Shaded), partial module shading (Partial Shading), varying temperatures of module (Varying Temp), soiling (Degraded), short circuits (SC), and standard test conditions with irradiance at 1000 W/m² and a module temperature of 25° C. (STC)).

The features mentioned above are applied as inputs to a multilayer feedforward neural network 54, which may be referred to as a multilayer perceptron (MLP). In some embodiments, a 5-layered neural network 54 is deployed with backpropagation to optimize the weights used in each layer. Measurement features (e.g., $V_{oc}$, $I_{sc}$, $V_{mp}$, $I_{mp}$, temperature, irradiance, fill factor, power, and gamma) are received at an input layer 56. One or more hidden layers 58 (e.g., 3 hidden layers) provide machine learning with neurons 60 which may be fully connected or sparsely connected by synapses 62. In some examples, each of the hidden layers 58 includes six neurons 60, though more or fewer may be deployed depending on performance requirements and available computing resources. At a decision layer 64 (which may also be considered an output layer), occurrence of a fault is detected and identified among a plurality of types of fault (e.g., ground fault, arc fault, complete shading, partial shading, varying temperature, soiling, short circuit, and standard test conditions)

Information flows through the neural network 54 in two ways: (i) In forward propagation, the MLP model predicts the output for received data, and (ii) In backpropagation, the model adjusts its parameters (e.g., weights of synapses 62 and/or neurons 60) considering errors in the prediction(s). An activation function used in each neuron 60 allows the MLP to learn a complex function mapping. Input to the model is the feature vector x, the output of the first and consecutive hidden layer 58 is given by $$h_1 = \sigma(W_1 \cdot x + b_1) \qquad \text{Equation 1}$$

$$h_i = \sigma(W_i \cdot h_{i-1} + b_i) \qquad \text{Equation 2}$$

where i is the layer size and a is the activation function. x has a dimension of 48000×9. Each column represents a feature of the neural network 54 mentioned earlier.

The output of the MLP is obtained as:

$$\hat{y} = \phi_{softmax}(h_{out}) \qquad \text{Equation 3}$$

Weights of each neuron 60 and/or synapse 62 are trained using a scaled gradient backpropagation algorithm. Each layer is assigned a tanh (hyperbolic tangent) activation function. The tanh boundary gives the best accuracy. The output layer (e.g., decision layer 64) uses a SoftMax activation function to categorize the type of fault in the PV array 12.

Figure 8:
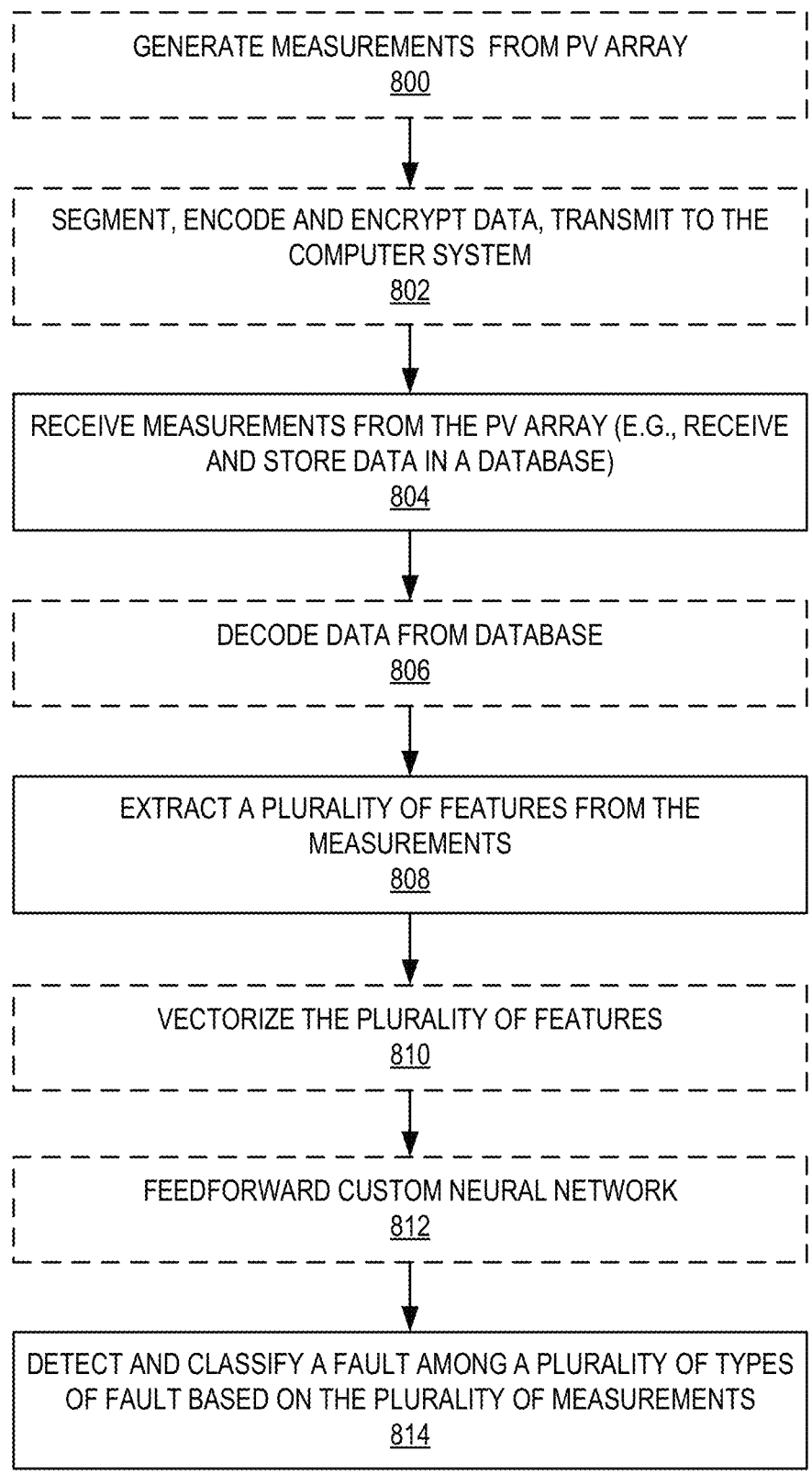
FIG. 8 is a block diagram of a process for fault detection and classification using the solar monitoring system of FIG. 3.

FIG. 8 is a block diagram of a process for fault detection and classification using the solar monitoring system 14 of FIG. 3. The process described in FIG. 8 can detect and identify faults in real time. Optional steps are shown in dashed boxes. The process may optionally begin with generating measurements from a PV array (e.g., with an SMD at each PV module) (block 800). The measurements may be segmented, encoded, and encrypted as data which is transmitted to a computer system (e.g., a server implementing the neural network) (block 802).

The measurements from the PV array are received (e.g., by the computer system receiving and storing the data in a database) (block 804). The computer system optionally decodes the stored data (block 806) and extracts a plurality of features from the measurements of the PV array (block 808). The plurality of features are vectorized (e.g., at the input layer) (block 810) and passed to a feedforward custom neural network (block 812). Finally, a fault is detected and classified among a plurality of types of fault based on the plurality of features (e.g., the feature vector after being fed into the neural network) (block 814).

Figure 9:
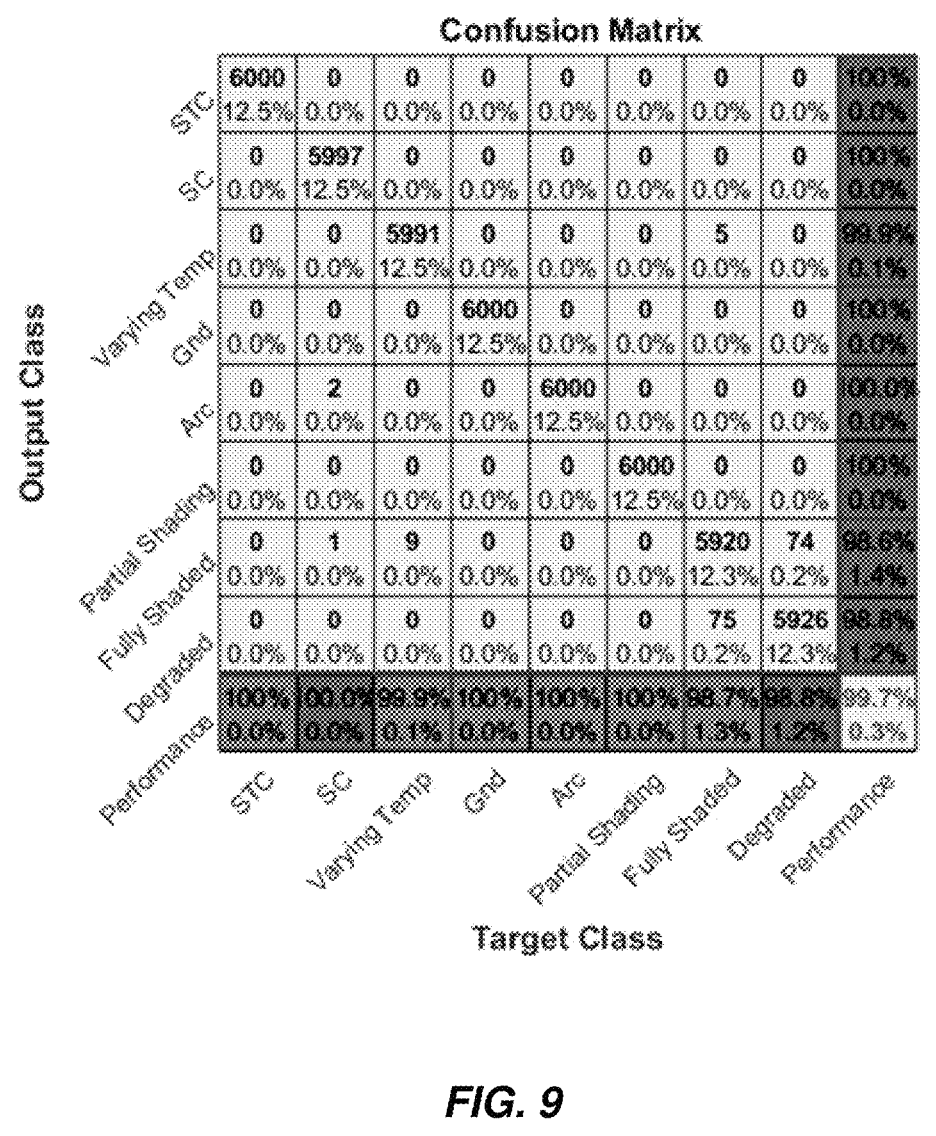

FIG. 9 is a graphical representation of a confusion matrix for fault classification. Each fault type is simulated versus shading versus standard conditions so as to have the same number of data points and avoid bias in the training of the neural network. For the training of the neural network, 70% of labelled data can be used for training, 15% of data is used for validation, and the remaining 15% of data is used as a test dataset, allowing the algorithm to classify the "unknown" testing data points. The results of the algorithm are shown in the form of the confusion matrix in FIG. 9. This illustrates the neural network of FIG. 7 obtains an accuracy of over 99%. This is a significant improvement from previous fault detection and identification methods.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A fault-identifying neural network for a photovoltaic (PV) array, comprising:
    an input layer configured to receive measurements from the PV array;
    a hidden layer configured to analyze the received measurements;
    a decision layer configured to classify a type of fault among a plurality of types of fault in the analyzed measurements; and
    one or more additional hidden layers.

2. The fault-identifying neural network of claim 1, wherein the fault-identifying neural network comprises a multilayer perceptron.

3. The fault-identifying neural network of claim 2, wherein:
    in forward propagation, the fault-identifying neural network predicts an output comprising the type of fault; and
    in backpropagation, the fault-identifying neural network adjusts its parameters based on prediction errors.

4. A fault-identifying neural network for a photovoltaic (PV) array, comprising:
    an input layer configured to receive measurements from the PV array;
    a hidden layer configured to analyze the received measurements;
    a decision layer configured to classify a type of fault among a plurality of types of fault in the analyzed measurements; and
    two or more additional hidden layers.

5. The fault-identifying neural network of claim 1, wherein the fault-identifying neural network is further configured to classify the type of fault by assessing the received measurements against two or more of a ground fault, an arc fault, complete shading, partial shading, varying temperature, soiling, a short circuit, or standard test conditions of the PV array.

6. The fault-identifying neural network of claim 5, wherein the fault-identifying neural network is further configured to classify the type of fault on a per-PV module basis.

7. The fault-identifying neural network of claim 1, wherein the measurements from the PV array are received by the input layer as a feature vector comprising a plurality of measurements for a plurality of PV features.

8. The fault-identifying neural network of claim 7, wherein the plurality of PV features comprises open circuit voltage, short circuit current, and one or more of: maximum voltage, maximum current, temperature, irradiance, fill factor, power, or a ratio of power over irradiance (y).

9. A fault-identifying neural network for a photovoltaic (PV) array, comprising:
    an input layer configured to receive measurements from the PV array;
    a hidden layer configured to analyze the received measurements; and
    a decision layer configured to classify a type of fault among a plurality of types of fault in the analyzed measurements,
    wherein the plurality of PV features comprises open circuit voltage, short circuit current, maximum voltage, maximum current, temperature, irradiance, fill factor, power, and y,
    wherein the plurality of PV features comprises open circuit voltage, short circuit current, and one or more of: maximum voltage, maximum current, temperature, irradiance, fill factor, power, or a ratio of power over irradiance (y), and
    wherein the measurements from the PV array are received by the input layer as a feature vector comprising a plurality of measurements for a plurality of PV features.

\* \* \* \* \*